United States Patent [19]

Cole et al.

[11] Patent Number: 5,216,802
[45] Date of Patent: Jun. 8, 1993

[54] METHOD OF USING A CONVERTIBLE METERED POWER SYSTEM TO CONVERT BETWEEN TEMPORARY AND PERMANENT METERED ELECTRIC SERVICE

[76] Inventors: Michael P. Cole, Rte. 1, Box 473, Monticello, Ga. 31064; Gregory L. Heard, 2463 Highway 81 West, Hampton, Ga. 30228

[21] Appl. No.: 837,042

[22] Filed: Feb. 18, 1992

Related U.S. Application Data

[63] Continuation of Ser. No. 342,297, Apr. 24, 1989, Pat. No. 5,097,383.

[51] Int. Cl.⁵ .......................................... H01R 43/00
[52] U.S. Cl. ...................................... 29/825; 361/364; 439/169
[58] Field of Search .................... 29/830; 439/169; 361/364

[56] References Cited

U.S. PATENT DOCUMENTS

| | | | |
|---|---|---|---|
| 2,691,769 | 10/1954 | Knopp | 439/167 |
| 5,033,973 | 7/1991 | Pruehs et al. | 439/167 |
| 5,068,962 | 12/1991 | Germer et al. | 29/830 |

*Primary Examiner*—Carl J. Arbes
*Attorney, Agent, or Firm*—Louis T. Isaf

[57] ABSTRACT

A convertible, metered, power system, apparatus and method, of readily converting a construction site electric meter box between providing temporary metered power and providing permanent metered power; wherein the method of the present invention includes connecting a service line to the permanent meter box and diverting metered power from the meter away from the construction structure wiring, and into one or more, portable, temporary power outlets. In the preferred embodiment, the diversion and the portable power outlets are provided by the unique, portable, temporary electric service assembly of the present invented apparatus.

5 Claims, 2 Drawing Sheets

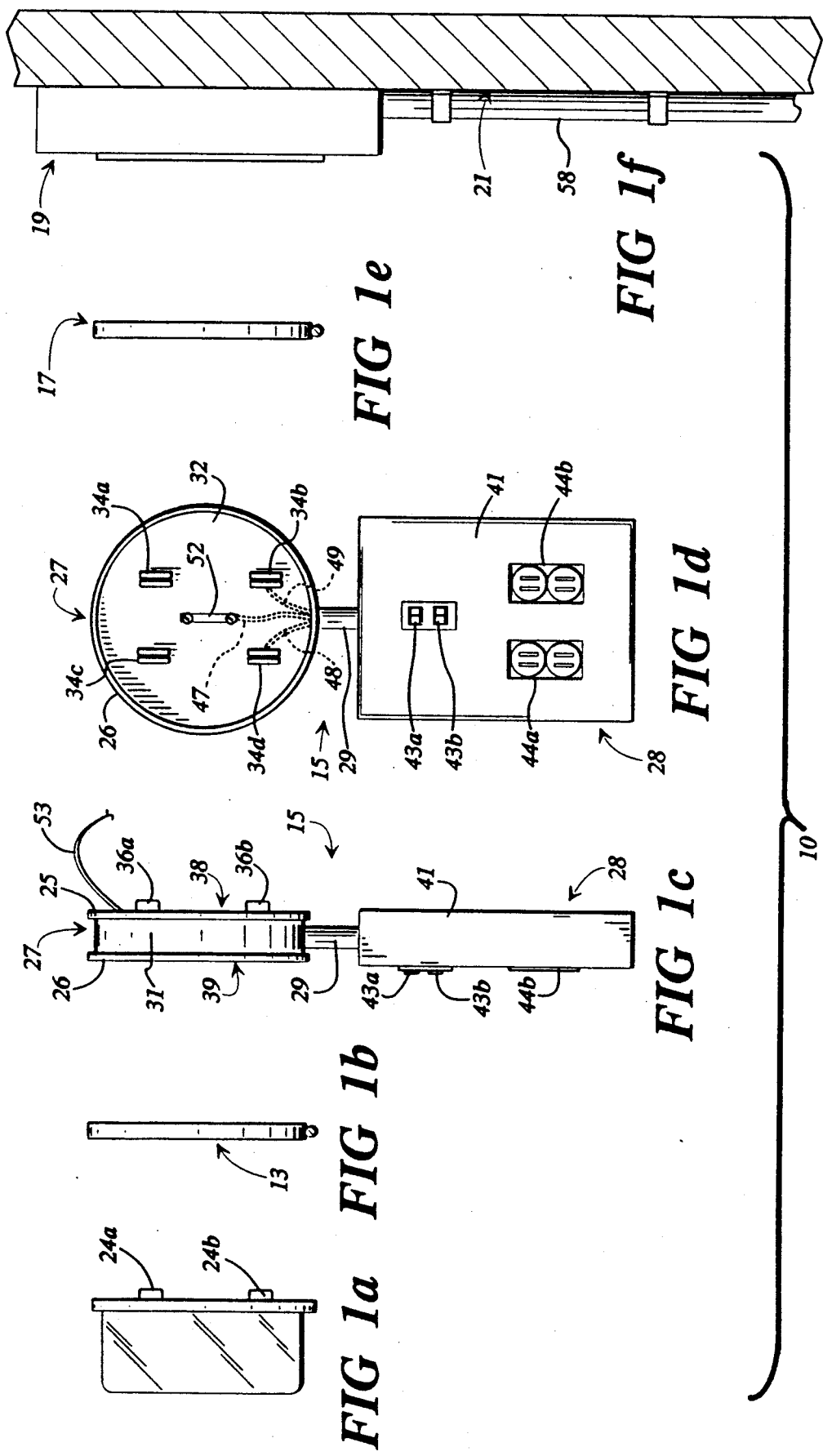

METHOD OF USING A CONVERTIBLE METERED POWER SYSTEM TO CONVERT BETWEEN TEMPORARY AND PERMANENT METERED ELECTRIC SERVICE

CROSS-REFERENCE

This application is a continuation of U.S. application Ser. No. 07/342,297 filed on Apr. 24, 1989, now U.S. Pat. No. 5,097,383 on Mar. 17, 1992.

BACKGROUND OF THE INVENTION

This invention relates generally to the field of providing metered, electric power service to residences and other habitable structures, and more specifically to the providing of temporary, metered, electric service to a construction site during the time of construction of a habitable structure.

The prior methods of underground installation of electric power service to a residence or other habitable structure consist of a typical pattern of labor and equipment visits to the residence site, an example of each pattern being typically as follows: (i) in the early stages of construction of the residence, electric power is made available to construction crews from a temporary electric service meter outfitted with power outlets and circuit breakers (sometimes, collectively called a "stub-out") located at of near the construction site (for example, at the street); and the electricity drawn through the stubout is metered at a relatively low, construction rate; (ii) in the process of construction, the permanent power distribution network (i.e. wiring, breakers outlets, switches, etc.) of the residence is installed throughout the residence, a permanent meter box is mounted to the residence, and the permanent wiring is connected to the permanent meter base at the permanent meter box; (iii) at an appropriate time, the construction crew calls the power company and requests that the power lines be extended to the residence permanent meter box, for example, at a time prior to the installing of the lawn or driveway; (iv) once called to extend the lines to the house, a "cut-in crew" comprising two or three laborers, digging equipment and wire splicing equipment makes an initial trip during which a service wire is layed, by digging a trench and burying the wire, extending from the temporary stubout to the location of the permanent meter box; (v) it is very often not legally possible for the power company to connect the service line to the permanent meter box at the time of this initial visit by the cut-in crew, since a building inspector must have approved the permanent wiring before the power company may connect the live service wire to the residential wiring, and the reality of the construction site is that coordination of wiring completion, utility crew availability, lawn and yard installation timing, and building inspectors availability is seldom precise; (vi) thus, if the inspector has not arrived prior to laying of the service line, the construction crew must either go without power or the temporary stubout must be left in place, and in the latter case, the service line, though layed and buried, must be left with at least its source end un-buried and un-connected, awaiting another time for completed connection; (vii) in the event the construction crew elected to continue using the stubout, a second trip by a power company cut-in crew and its equipment is necessary after the inspector's approval in order to make the final connections of the service line to the residence, and this trip requires virtually the same equipment and time as the initial visit by the cut-in crew; (viii) during this final visit of the cut-in crew, the permanent meter is mounted at the permanent meter base and is set with the residential meter rate (or other appropriate consumer rate), which is relatively higher than the construction rate.

The prior methods of overhead installation are similar to the above outlined pattern for underground installation, and include an initial trip to hang the service wire to the residence, and, if temporary service was still needed while waiting for the inspector, or for some other reason, then a second trip, utilizing virtually the same personnel and equipment is necessary in order to disconnect the temporary stub-out service from the power pole and connect the service line permanently to the residence.

It should be clear that the foregoing pattern of installation is very inefficient and expensive, making inefficient use of expensive laborers and equipment. In some construction scenarios, it is possible to combine steps and eliminate some of the efficiency; however, prior to the present invention, there remained the need to find a satisfactory manner to eliminate the inefficiencies resulting from the conflicts between the contractor's planning, the availability of the utility's cut-in-crews, and the government inspector's availability.

SUMMARY OF THE INVENTION

Briefly described, the present invention comprises a convertible, metered, power system, apparatus and method, of readily converting a construction site electric meter box between providing temporary metered power and providing permanent metered power. The apparatus of the present invention includes a standard meter box with a meter base and mating meter, and a portable, temporary electric service assembly (the "Porta-temp" assembly). The Porta-temp assembly comprises an interface portion which is adapted to the standard meter box to isolate the permanent, residence wiring connection at the meter base from electricity moving through the meter. The porta-temp also comprises a power distribution portion to which power normally directed from the meter to the residence wiring is diverted by the interface portion, thus supplying metered, temporary power for use by the contractor.

The present system, method and apparatus, provides for adaptation of the permanent meter box as a temporary meter box, and, at the same time diverts power from the permanent, residence wiring to the temporary, distribution portion of the porta-temp assembly, thereby providing for permanent installation of the permanent meter box, permanent connection of the residence wiring to the permanent meter box, and permanent connection of the service line to the permanent meter box all prior to inspection by the government inspector, while at the same time providing temporary, metered power from the permanent meter mounted at the permanent meter box base.

The method of the present invention includes connecting the service line to the permanent meter box and diverting metered power from the meter, away from the residence wiring, and into one or more, portable, temporary power outlets. The method of the present invention allows for the elimination of a second trip by the power company's costly cut-in crew personnel and equipment, in the event that the inspector has not approved the permanent wiring or for some other reason the builder needed temporary power and didn't want to use the residence wiring. That is, for example, the present method would eliminate the second cut-in crew visit of the prior art pattern item "vii" mentioned above. After inspection, there is required a visit by only one meter man to remove the porta-temp assembly and set the residential/consumer meter rate; and this is at a great savings to the power company as compared to the cost of the multiple men and equipment of the second cut-in crew. In the preferred embodiment, the diversion and the portable power outlets are provided by the portable, temporary electric service assembly of the present invented apparatus.

It is, therefore, an object of the present invention to provide a metered power system that reduces the number of service calls necessary under the previous methods to complete the installation of permanent electric power service to a new residence or other, new, habitable structure.

Another object of the present invention is to provide a metered power system that provides for the final connection of both the permanent residence wiring and of the live power service line to the permanent meter box, even while temporary power is being utilized and before final electrical inspection by a government building inspector (or before the users are ready to use the residence wiring).

Yet another object of the present invention is to provide an electric service metering apparatus convertible between a metering apparatus providing permanent, metered electric service and a metering apparatus providing temporary, metered electric service.

Still another object of the present invention is to provide a self-contained, easy to install, temporary, portable electric service assembly which quickly and easily converts a standard meter box, mounted to a habitable structure, between a meter box providing temporary metered electric service to the structure and a meter box providing permanent, metered electric service to power outlets integral to the portable electric service apparatus.

Other objects, features and advantages of the present invention will become apparent upon reading and understanding the present specification, taken in conjunction with the accompanying drawings.

BRIEF DESCRIPTION OF THE DRAWINGS

FIGS. 1a-1f show an exploded, side view of a convertible, service metering apparatus in accordance with a preferred embodiment of the present invention, with one of the component parts shown in two views, wherein the component parts are represented by the segmented FIGS. as follows:

FIG. 1a is an isolated, right side view of a meter of the, convertible metering apparatus;

FIG. 1b is an isolated, right side view of a locking meter ring of the convertible metering apparatus;

FIG. 1c is an isolated right side view of a portable, temporary electric service assembly of the convertible metering apparatus;

FIG. 1d is an isolated, front view of that same portable, temporary, electric service assembly of FIG. 1c;

FIG. 1e is an isolated, right side view of a locking ring of the convertible metering apparatus;

FIG. 1f is an isolated, right side view of a meter base of the convertible metering apparatus, shown mounted to a habitable structure, such as a house.

FIG. 2b is an isolated, right side view of the meter of FIG. 1a, shown in alignment with the portable, temporary, electric service assembly of FIG. 2a.

DETAILED DESCRIPTION OF THE PREFERRED EMBODIMENT

Figure 2A:
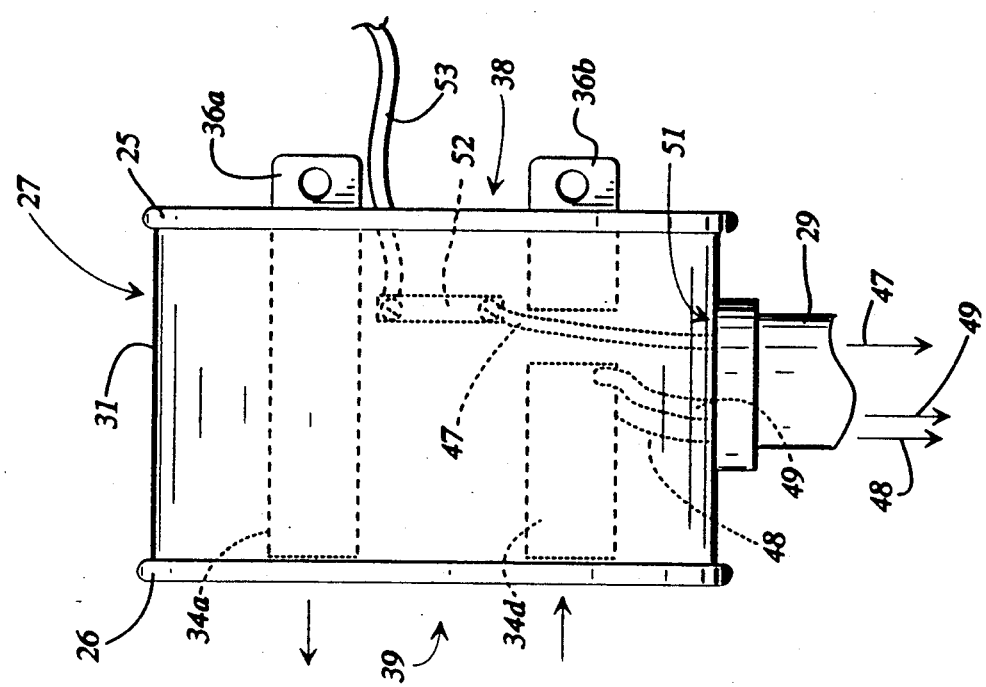
FIG. 2a an isolated, cross-sectional, right side view of the interface portion of the portable, temporary, electric service assembly of FIG. 1c.
Figure 2B:
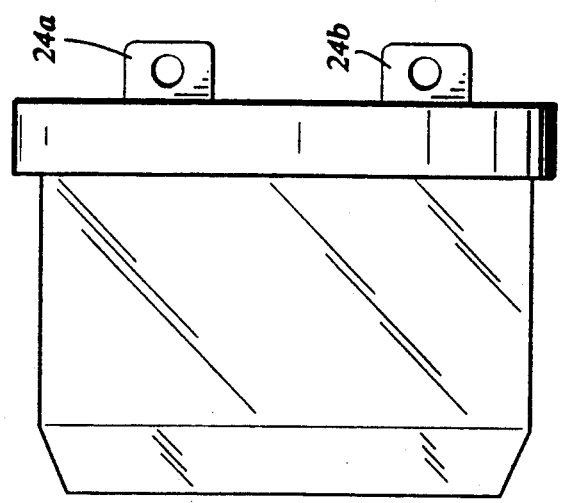

Referring now in greater detail to the drawings, in which like numerals represent like components throughout the several views, FIGS. 1a-1f show a preferred embodiment of a convertible electric service metering apparatus 10 of the present invention as including a meter 12, locking meter ring 13, a portable, temporary, electric service assembly 15 (also referred to herein as the "porta-temp assembly 15"), a locking base ring 17, and a meter base 19.

The meter 12, locking meter ring 13, and meter base 19 are all, preferably, the standard components of a standard, electric service meter box, of a type known in the industry. The meter 12 and meter base 19 are, as known in the industry, mating components; and the meter 12 has male prongs 24 that coincide with female prongs (not seen) in the meter base 19. The prongs, as known in the industry, function as electrical terminals and, also, function to provide a certain amount of structural support to the mating of the meter 12 and meter base 19.

The porta-temp assembly 15 is seen as including an interface portion 27 and a power distribution portion 28 connected to one another through a conduit member 29 to form the porta-temp assembly as an integral unit. The interface portion 27 includes a body member 31 which, in the disclosed, preferred embodiment, is generally cylindrical in shape and includes a support segment 32 fixed within the body member. The body member 31 defines a base engaging rim 25 and a meter engaging rim 26. Supported from the support segment 32 are a plurality of female prongs 34 and a plurality of male prongs 36. In the preferred, disclosed embodiment, there are four female prongs 34a, 34b, 34c, 34d (see FIG. 1d) and four male prongs (only male prongs 36a and 36b are seen in the drawings), which number corresponds to the number of prongs in the standard, meter box base and meter utilized in this particular embodiment. The male prongs 34 protrude, as seen in FIGS. 1c and 2a, out of the body member 31 from partially within the body member, on the meter base side 38 of the interface portion 27. The female prongs 34, with reference to FIGS. 1c, 1d and 2a, are supported with the body member 31, exposed on the meter side 39 of the interface portion 27. The prongs 34, 36 function either as electrical conductors (and terminals) or as stabilizing elements (i.e. during mounting to the meter base and meter) or both.

Referring to FIGS. 1c, 1d and 2a, the power distribution portion 28 of the porta-temp assembly 15 is seen as including a housing 41 in the form of a cabinet defining an interior cavity within which are mounted breaker controlled, power circuits with power outlets. The herein disclosed embodiment shows two, 20 amp. circuit breakers 43a, 43b, and two duplex, 110 volt, ground fault, power outlets 44a, 44b, one outlet connected by wiring (not seen) to each breaker, all of which is clearly understood in the industry. The porta-temp assembly 15 further includes a ground wire 47 and two power wires 48, 49 extending from the interface portion 27, through a portal 51 in the interface portion body member 31, through the conduit member 29, and into the power distribution portion 28 where they connect to the mounted power circuits. The ground wire 47 connects in the interface portion 27 to a ground terminal 52, to which is connected a ground wire extension 53 by which the porta-temp assembly 15 is grounded to the meter base 19 while mounted thereon.

In the disclosed embodiment, the female prongs 34 cooperate, electrically, in sets, and, more specifically, in the disclosed embodiment, in pairs; that is, a first prong set is a prong pair comprising the upper, female prongs 34a, 34c, a second prong set is a prong pair comprising the lower, female prongs 34b, 34d, a third prong set is a prong pair comprising the upper, male prongs 36a (36c, not seen), and a fourth prong set is a prong pair comprising the lower, male prongs 36b (36d, not seen). It can be seen, with reference to FIG. 2a, that the upper female prongs 34a, 34c are each connected electrically, (and in this disclosed embodiment, also structurally) to one of the upper male prongs 36a (36c). The power wires 48, 49 are connected to the lower, female prong pair, one to each of the lower, female prongs 34b, 34d. The prongs of the lower, male prong pair 36b (36d) are "dummy prongs"; that is, this prong pair is isolated, electrically, from the other prong pairs 34a-34c, 34b-34d, 36a,(36c) and from the wires 48, 49 of the porta-temp assembly 15, and as such, the lower, male prong pair 36b (36d) does not function as an electrical conductor.

Set-up and operation. The method of the present invention is, in its preferred embodiment, associated with a point in time when a construction crew calls for power lines to be extended to the meter box of a residence or other structure 21 on which they have been working. In accordance with the method of the present invention, the meter box (or at least the meter base 19) is, preferably, installed at its intended permanent location at the residence 21. The entire porta-temp assembly 15, being a portable, integral unit, is attached to the meter base 19. As is apparent from the drawings and a knowledge of the industry, the base engaging rim 25 engages the meter base 19 and is clamped tightly against the base by the locking base ring 17. The male prongs 36 of the porta-temp assembly 15 coincide with the female prongs (not seen) of the meter base 19. The power meter 12 is attached to the interface portion 27 of the porta-temp assembly 15. As is apparent from the drawings, the meter 12 engages the meter engaging rim 26 and is clamped tightly against the interface portion 27 by the locking meter ring 13. In the manner that the meter 12 is usually attached to the standard meter base 19, the male prongs 24 of the meter coincide with the female prongs 34 of the porta-temp assembly 15.

A service line 58 is brought to the meter base 19 from the community power line at, for example, the street. The service wire 58 is connected to the upper, female prongs (not seen) of the meter base 19, those prongs coinciding with the upper, male prong set 36a (36c) of the porta-temp assembly 15. The power distribution network (not seen) of the residence 21 is, typically, installed within the residence and connected to the meter base 19 prior to the connecting of the service line 58 to the meter base 19; although, it is readily apparent, given the nature of the convertible electric service metering apparatus 10 of the present invention, that the method of the present invention provides, in alternate embodiments, for the residence network to be installed simultaneous with or subsequent to the connecting of the service line 58 to the meter base 19. The residence distribution network is attached to the lower, female prongs (not seen) of the meter base 19, those prongs coinciding with the lower, male prong set 36b (36d) (that is, the "dummy prongs") of the porta-temp assembly 15. It can be seen that the power is delivered form the community power lines in, for example, the street by the service wire 58 to the permanent meter base 19 and routed into the porta-temp assembly 15 at the upper, male prong set 36a (36c), where the power is usually delivered into the meter 12. The power passes through the connected upper, male prong set 36a (36c) and upper, female prong set 34a, 34c to the upper, male prong set 24a (24c) of the meter 12, through the meter to the lower, male prong set 24b (24d) of the meter (being those prongs usually reserved for the power going into the residence), and is routed back in to the porta-temp assembly 15 at the lower, female prong set 34b, 34d. At this point, the power is diverted along wires 48, 49 into the porta-temp assembly's power distribution portion 28, avoiding the isolated dummy prongs 36b (36c) and bypassing the residence power distribution network. Thus, the porta-temp assembly 15 functions to provide a temporary, power distribution network, whereby power is supplied at the power outlets 44a, 44b of the porta-temp assembly for metered, temporary use by the construction crew.

When the construction is completed, or when the government inspector has approved the residence wiring, or at any other appropriate or desired time, the convertible, electric service metering apparatus 10 is converted form providing temporary, metered power to providing permanent metered power. This is accomplished by loosening the locking meter ring 13, removing the meter 12 from the porta-temp assembly 15, loosening the locking base ring 17, removing the porta-temp assembly from the meter base 19 and mounting the same meter 12 to the base 19, using either of the locking rings. The porta-temp assembly 15 being an integral, portable unit, and the mounting of the meter 12 to the base 19 being a rather simple and standard procedure, this conversion process can be accomplished, if desired, by one person. The meter man who performs the conversion is also able if desired, to take a final reading for the temporary power and re-set the meter 13 from the construction rate to the consumer rate.

We claim:

1. Method of supplying electrical power to the permanent installation location of a construction site, comprising the steps of:

installing a meter base at its intended permanent location on a construction site;

connecting a power line to the power-in terminal of the meter base, in its intended permanent manner;

temporarily, electrically connecting the meter base power-in terminal to the power-in terminal of the meter;

temporarily, electrically connecting the power-out terminal of the meter to one or more portable power outlets;

electrically isolating the power-out terminal of the meter base from the meter;

assembling the permanent power distribution network within the construction site structure; and connecting the permanent distribution network of the structure to the power-out terminal of the meter base, in its intended permanent manner, whereby the connection of the permanent wiring to the meter base and the temporary connections between the meter base and meter and between the meter and portable outlet are capable of existing simultaneously, yet metered power is provided only to the portable outlet.

2. Method of claim 1, further comprising the steps of:
removing the temporary connection between the meter base and the meter and removing the temporary connection between the temporary connection between meter and the one or more portable power outlets; and
electrically connecting the power-in terminal of the meter base to the power-in terminal of the meter and the power-out terminal of the meter to the power-out terminal of the meter base,
whereby metered power is provided to the permanent wiring, and power is no longer provided to the one or more portable outlets.

3. Method of claim 2, wherein the step of temporarily, electrically connecting the meter base power-in terminal to the power-in terminal of the meter comprises the steps of physically mounting an interface unit to the meter base, physically mounting the meter to the interface unit, and providing the interface unit with an electrical conductor which connects between the power-in terminal of the meter base and the power-in terminal of the meter; and
wherein the step of temporarily, electrically connecting the power-out terminal of the meter to one or more portable power outlets comprises the step of physically mounting one or more power outlets to the interface unit and providing the interface unit with electrical conductors which connect between the power-out terminal of the meter and the one or more power outlets.

4. Method of claim 3, wherein the step of physically mounting one or more power outlets to the interface unit comprises the step of physically mounting one or more power outlets together with one or more circuit breakers in a housing attached to the interface unit.

5. Method of claim 3, wherein the steps of removing the temporary connections comprises the step of dismounting the interface unit from the meter base, and wherein the step of electrically connecting the power-in terminal of the meter base to the power-in terminal of the meter and the power-out terminal of the meter to the power-out terminal of the meter base, comprises the step of mounting the meter directly to the meter base.

* * * * *